United States Patent
Cohn et al.

(10) Patent No.: US 6,832,361 B2
(45) Date of Patent: Dec. 14, 2004

(54) SYSTEM AND METHOD FOR ANALYZING POWER DISTRIBUTION USING STATIC TIMING ANALYSIS

(75) Inventors: John Maxwell Cohn, Richmond, VT (US); Scott Whitney Gould, South Burlington, VT (US); Ronald Dennis Rose, Essex Junction, VT (US); Ivan Wemple, Shelburne, VT (US); Paul Steven Zuchowski, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 380 days.

(21) Appl. No.: 09/862,427

(22) Filed: May 21, 2001

(65) Prior Publication Data

US 2002/0174409 A1 Nov. 21, 2002

(51) Int. Cl.[7] .............................................. G06F 17/50
(52) U.S. Cl. .................................. 716/6; 716/5; 716/4
(58) Field of Search ..................................... 716/6, 5, 4

(56) References Cited

U.S. PATENT DOCUMENTS

| | | |
|---|---|---|
| 5,191,541 A | 3/1993 | Landman et al. |
| 5,682,320 A | 10/1997 | Khouja et al. |
| 5,696,694 A | 12/1997 | Khouja et al. |
| 5,768,145 A | 6/1998 | Roethig |
| 6,405,348 B1 * | 6/2002 | Fallah-Tehrani et al. ........ 716/4 |

OTHER PUBLICATIONS

"P1497 Draft Standard for Standard Delay Format (SDF)", IEEE, May 28, 1999.*

* cited by examiner

*Primary Examiner*—Matthew Smith
*Assistant Examiner*—Brandon Bowers
(74) *Attorney, Agent, or Firm*—Richard M. Kotulak, Esq.; McGinn & Gibb, PLLC

(57) ABSTRACT

A method and system for analyzing power distribution in an integrated circuit chip includes dividing a clock cycle of the integrated circuit chip into a plurality of time periods, dividing the integrated circuit chip into a plurality of cells, performing a static timing analysis for the plurality of cells to obtain current waveform data for each cell and each time period, and performing a power distribution analysis using the current waveform data.

34 Claims, 4 Drawing Sheets

SYSTEM AND METHOD FOR ANALYZING POWER DISTRIBUTION USING STATIC TIMING ANALYSIS

BACKGROUND OF THE INVENTION

1. Field of the Invention

The present invention relates generally to a system and method for analyzing power distribution in an integrated circuit and more particularly, to a system and method for analyzing power distribution by using static timing analysis to calculate current waveforms.

2. Description of the Related Art

FIG. 1 provides a graphical representation of current in a typical integrated circuit chip over time. As indicated in FIG. 1, the current in the circuit rises to a peak sometime after the clock edge, and then gradually tapers off to near zero until the next clock edge occurs (assuming complementary metal oxide semiconductor (CMOS) logic). The height of each peak is a function of the number, location, and type of circuits switching. These parameters are controlled by the logical function of the chip and the data being supplied to the chip and can change on each subsequent clock cycle.

One goal of chip design is to optimize the power distribution on the chip so that each circuit on the chip is supplied with optimum supply voltage during each clock cycle. Of course, insufficient supply voltage would make the circuit slow and, perhaps, inoperable. Designers, on the other hand, must be careful not to overdesign the power distribution to each circuit because this would result in unnecessary chip size and wiring congestion.

In addition, designers are under increasing demand to reduce operating power, especially with respect to application specific integrated circuits (ASICs) and other advanced types of chips. As a result, chips are being designed to operate with lower power supply voltages and, in turn, lower device turn-on voltages. This causes a problem, however, because, as the device threshold voltage (Vt) and power grid supply voltages (Vdd) are reduced, the ratios of noise voltages to Vt and Vdd increase because the noise levels do not scale down at the same rate as Vt and Vdd. Consequently, circuit sensitivity to noise is increased in these new chips.

On the other hand, designers are also required to increase performance. Conventionally, designers improved performance by increasing signal current levels and/or duty cycles. However, high current levels create local and often sizable resistive voltage drops in the power supply wiring. In addition, increasing signal current levels and/or duty cycles further exacerbates the noise problems experienced in smaller chips and may also prevent the full Vdd supply voltage from being available to power some of the circuits on the chip.

Conventionally, chip designers use two methods to address this supply noise problem in smaller integrated circuit chips. One method is to "over-design" the circuits and/or the power distribution to make them either more tolerant of noise or power drops. However, this typically results in lower performance and/or increased power consumption, chip area and chip cost. In addition, because noise sensitivity problems are often not realized until very late in the circuit design process and sometimes not until after the chips is actually fabricated, this method typically requires subsequent re-modeling/simulation and/or redesign activity which can be expensive and time consuming.

Another method uses a power distribution analysis to identify potential problem areas or "hot spots" in the circuit that would compromise the integrity of the design. However, power distribution on a chip depends upon when and/or whether the various circuits on the chip will switch, which designers typically have no way of knowing with certainty. Therefore, some designers assume that all circuits are switching at the same time, such as on a leading edge of a clock. Although this "worst case scenario" makes power distribution analysis relatively easy, it is not very accurate because many portions of the integrated circuit do not switch at the same time. Therefore, the results would overstate voltage drops causing the chip to be over-designed.

Other chip designers may predict which circuits on the chip are switching and when they are switching by simulating functional patterns through the chip logic and capturing information about current draw and timing. In other words, real pattern sets are run through the chip and the switching information that is produced is captured. This analysis may be performed by automated simulation analysis programs which currently exist.

However, numerous patterns are required here which makes analysis costly. In addition, in spite of the numerous patterns, it remains likely that the maximum pattern (i.e., the pattern resulting in the maximum current for the circuit) will not be identified. Furthermore, there inevitably will be patterns which were not conceived or impossible to generate that will cause more switching activity than modeled. Therefore, this analysis commonly results in long analysis or design times and missed design errors.

SUMMARY OF THE INVENTION

In view of the foregoing and other problems, an object of the present invention is to provide a fast and accurate method and system for analyzing power distribution in an integrated circuit.

The inventive method for analyzing power distribution in an integrated circuit chip includes dividing a clock cycle of the integrated circuit chip into a plurality of time periods, dividing the integrated circuit chip into a plurality of cells, performing a static timing analysis for the plurality of cells to obtain current waveform data for each cell and each time period, and performing a power distribution analysis using the current waveform data.

The inventive method may further include generating a pre-characterized cell library containing cell characterization data and using the cell characterization data to perform the static timing analysis. Such cell characterization data may include charge data, timing data, voltage data, temperature data, load data, input slew rate data, direct current data and process corner data.

The inventive method may further include physically designing the integrated circuit chip using the pre-characterized cell library. Further, parasitic resistors, capacitors and inductors may be extracted from the physical design of the chip to generate an extracted signal net information which may be used to perform the static timing analysis.

The inventive method may further include refining the physical design of the integrated circuit chip using the current waveform data.

Further, the static timing analysis in the inventive method may determine when current is required on the integrated circuit chip, the amount of current required on the integrated circuit chip, and where current is required on the chip.

Further, the inventive method may assume that every circuit on the integrated circuit chip switches within a given clock cycle. The static timing analysis may include disregarding circuits which cannot switch during a same time period. In addition, each of said time periods may be greater than or equal to a rise or fall time that captures 95% of signals on the integrated circuit chip.

The static timing analysis may further include assigning a charge used by a circuit to at least one time period, calculating node voltages for each time period, checking calculated node voltages against allowable limits, calculating current densities using the calculated node voltages, and checking the calculated node voltages against electromigration and local heating rules.

The calculated node voltages may further be back annotated so that the static timing analysis is performed using the calculated node voltages.

In another aspect, a system according to the present invention may include a chip design device for using pre-characterized cell data to logically and physically design the integrated circuit chip, power grid extracting means, for inputting physical design data from the chip design means and generating extracted signal net information, and a static timing analysis tool, for inputting the extracted signal net information and the physical design data and generating current waveform data. The system may further include a power distribution analysis tool, for inputting the current waveform data and generating power distribution data.

With its unique and novel features and designs, the inventive system and method provide fast and effective means for accurately analyzing the power distribution on an integrated circuit. The inventive system and method quickly and accurately predicts the current waveforms while not over-predicting them by so much that the product is grossly over-designed.

BRIEF DESCRIPTION OF THE DRAWINGS

The foregoing and other objects, aspects and advantages will be better understood from the following detailed description of a preferred embodiment(s) of the invention with reference to the drawings, in which.

DETAILED DESCRIPTION OF PREFERRED EMBODIMENTS OF THE INVENTION

Figure 1:
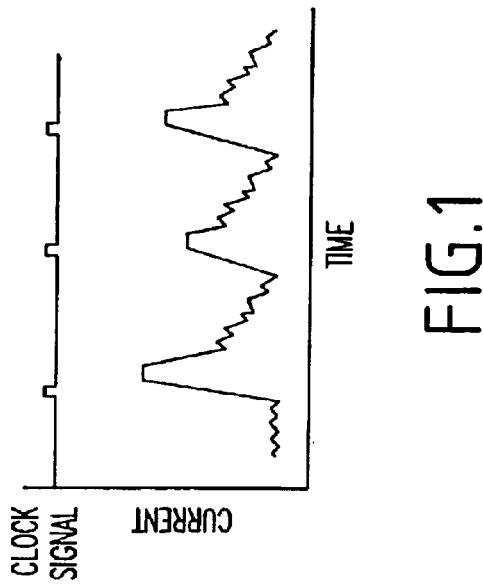
FIG. 1 is a graphical representation of current in a portion of a typical integrated circuit chip over time.
Figure 2:
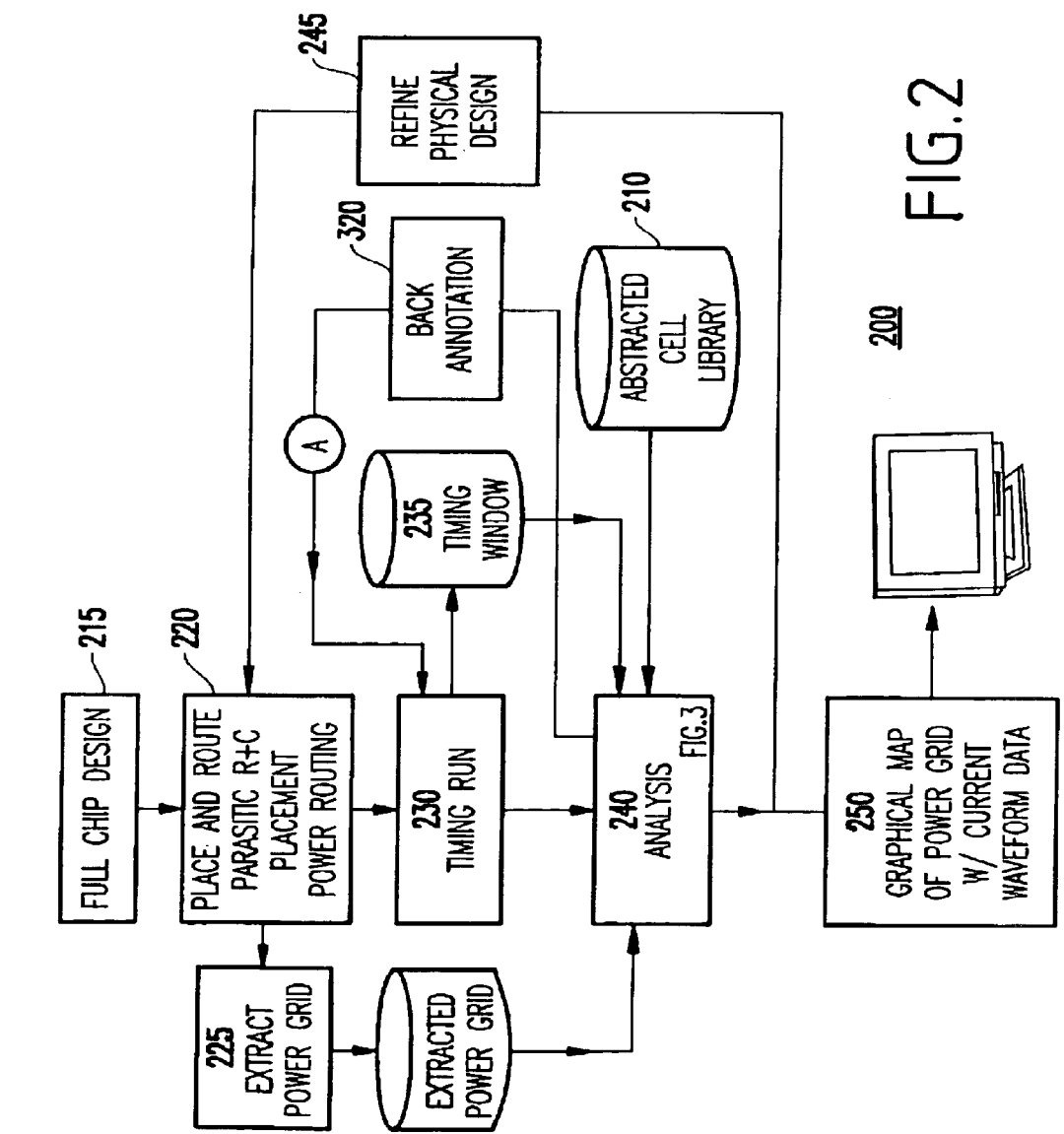
FIG. 2 is a flow diagram illustrating a method for analyzing power distribution according to the present invention.

Referring now to the drawings, FIG. 2 is a flow diagram illustrating a method 200 of analyzing power distribution according to the present invention.

As noted above, to perform power distribution analysis, a designer must know when and/or whether the various circuits on the chip will switch, which designers typically have no way of knowing with certainty. However, the inventors have discovered that the following assumptions can be made with respect to when and/or whether a given circuit on the chip will switch to provide a simple yet effective power distribution analysis:

1. All circuits are switching in the same direction at the same time. This may be refined to exclude circuits that cannot possibly switch within a given interval. No attempt is made to determine which direction a circuit is switching as this would require information about "patterns" which is often not available to the designer or the customer.

2. All circuits are switching in the same direction. First, it is assumed that all circuits switch up, then it is assumed that all circuits switch down. Further, it is assumed that one of these two scenarios is the worst case. An extension to the invention may include looking at the logic of the design and excluding particular circuits from consideration due to the logic design considerations (e.g., two inverters in series can't both switch up at the same time).

3. All circuits are switching "quickly" meaning that the circuits switch in some fraction of the clock cycle time. Although there is a method for dealing with circuits that switch slowly, it may safely be assumed that the majority of circuits switch quickly.

Referring again to FIG. 2, the inventive method 200 uses static timing analysis 240 to calculate current waveforms for use in power distribution analysis. Thus, synchronous logic which uses a clock to define a clock cycle time is assumed. Static timing analysis assumes that a signal will propagate from one sequential element to another within one clock cycle. The advantage of static timing analysis is that numerous data patterns need not be input into the circuit. All circuitry comprising the circuit is divided into combinational logic, where the output is purely a function of the inputs at the moment (plus some delay time for the signal to be driven through the combinational logic), and sequential logic where some memory buffering may occur.

The inventive method 200 pre-characterizes (210) the library of circuits that will be used on the chip design, so it is known what the circuits will do under a given set of stimuli (i.e., how fast the circuit will switch under a given set of conditions). Since a static timing tool is required for this invention, the circuits need to be characterized not only for charge (i.e., to calculate current), but also for timing characteristics (i.e., to calculate delay and output slew rate). The inventive method may, therefore, characterize (210) each circuit as a function of voltage, temperature, load, input slew rate and process corner. In addition, the circuits may be characterized (210) for any DC currents that are present.

The inventive method 200 further includes logically designing (215) the chip and using the resulting abstract design to physically design (220) the chip using the pre-characterized library. During this physical design (220), parasitic resistors, inductors and capacitors are placed and routed on the chip.

As shown in FIG. 2, the inventive method 200 combines this data from the physical design (220) of the chip (i.e., data regarding the parasitic resistors, capacitors and inductors and circuit placement) with timing information from the chip design (i.e., from the static timing tool) and information from the pre-characterized library. For complete power distribution analysis, a designer must understand what the power distribution looks like, as well as when and where current is required to flow, and how much current is required to flow. The static timing tool can help tell the designer "when" and "how much", but the designer needs to cross-reference data from the static timing tool with the physical design data to figure out the "where". Conventionally, the static timing tool was used only to determine "when" current is required (in fact, most designers would never have used a static timing tool to perform power distribution analysis). The inventive method 200, however, uses the static timing tool to determine "how much" current is required in addition to "when" current is required.

The inventive method 200 further extracts (225) parasitic resistance, inductance and capacitance (RLC) information from the physical design data. Here, the physical representation of the power distribution on the chip is used to build a simulated representation of this same data. In other words, the physical characteristics of the circuit (e.g., width, height, location on the chip, etc.) are converted into resistors, capacitors and inductors, which an analysis tool can use to develop a model of the chip. This can be accomplished by using, for example, a conventional software function called "extraction" which looks at the physical layout of the chip and tells the designer what parasitic R, L and Cs got formed.

Further, the RLC information may be extracted (225) for both the signal nets used in the static timing run (230) and the power distribution used in the static timing analysis (240). This may done separately (e.g., using different software tools) or combined. It should be noted that the static timing analysis tool uses extracted signal net information, not the extracted power grid information, which is only used during the simulation of the power grid.

In addition, the inventive method 200 uses data from the pre-characterized library to perform the static timing run (230) to determine "when" and "how much" current is required. Here, the designer needs signal slew rates and the charge consumed at each circuit on the chip. The slew rate is normally available from the static timer. The inventive method 200 requires the addition of the charge calculation to the static timing tool. This is straightforward because the static timing tool knows the circuit topology (via extraction) and combining this information with the pre-characterized cell information, the charge required by a switch of each circuit can be obtained.

In addition, although it cannot be determined whether a circuit is switching in any given clock cycle, it can be determined if a circuit is capable of switching if it were to switch. Therefore, the inventive method 200 forms timing windows (235) to determine which circuits are capable of switching simultaneously.

Further, multiple stages of logic are usually traversed in a given clock cycle. In other words, a signal is started at a clock cycle edge and propagated through many circuits before the next clock cycle. Ordinarily, circuits at the start of this path of logic switch prior to circuits that are farther downstream. Therefore, if the entire chip is broken down into circuits A, B, C, etc, since it is known that circuit A will take a certain amount of time, then circuit B will take a certain amount of time, etc., it is known that circuits A and B are not switching at the same time.

However, one little adjustment on the "when" is needed before the designer can proceed. Due to such factors as manufacturing tolerances and uncertainty in the exact temperature and voltage of the chip, a static timing tool cannot give a designer an absolute "when" but instead, gives the designer a range of "whens". Specifically, the static timing tool tells a designer that a signal can switch between two times, the earliest arrival time, and the latest arrival time.

However, as noted above, the inventive method 200 assumes a synchronous design so that the designer can divide time into units called clock cycles. A clock cycle is the amount of time between the rising or falling edges of two consecutive clock pulses. Conventional power distribution analysis tools using input patterns have to look at many clock cycles and are, therefore, very time consuming. The inventive method 200, on the other hand, assumes that every circuit on the chip will switch in the given clock cycle and, therefore, analyzes only one of these clock cycle intervals and is very time efficient.

Further, by using information from the static timing analysis (240), the times at which individual circuits switch can be spread out across the entire clock cycle and assigned to timing windows instead of being assumed to happen coincident with the clock edge. As noted above, the inventive method 200 performs the static timing analysis (240) by combining the extracted (225) resistors and capacitors and the cell characterization data developed during the physical design (220) with the data from the static timing run (230). In addition, the static timing analysis (240) is run on the entire chip at the same time. The data generated by the static timing analysis (240) may be used, for example, by a software program, to calculate the current waveforms and assign the waveforms to individual time periods (i.e., timing buckets) into which the clock cycle is divided.

Figure 3:
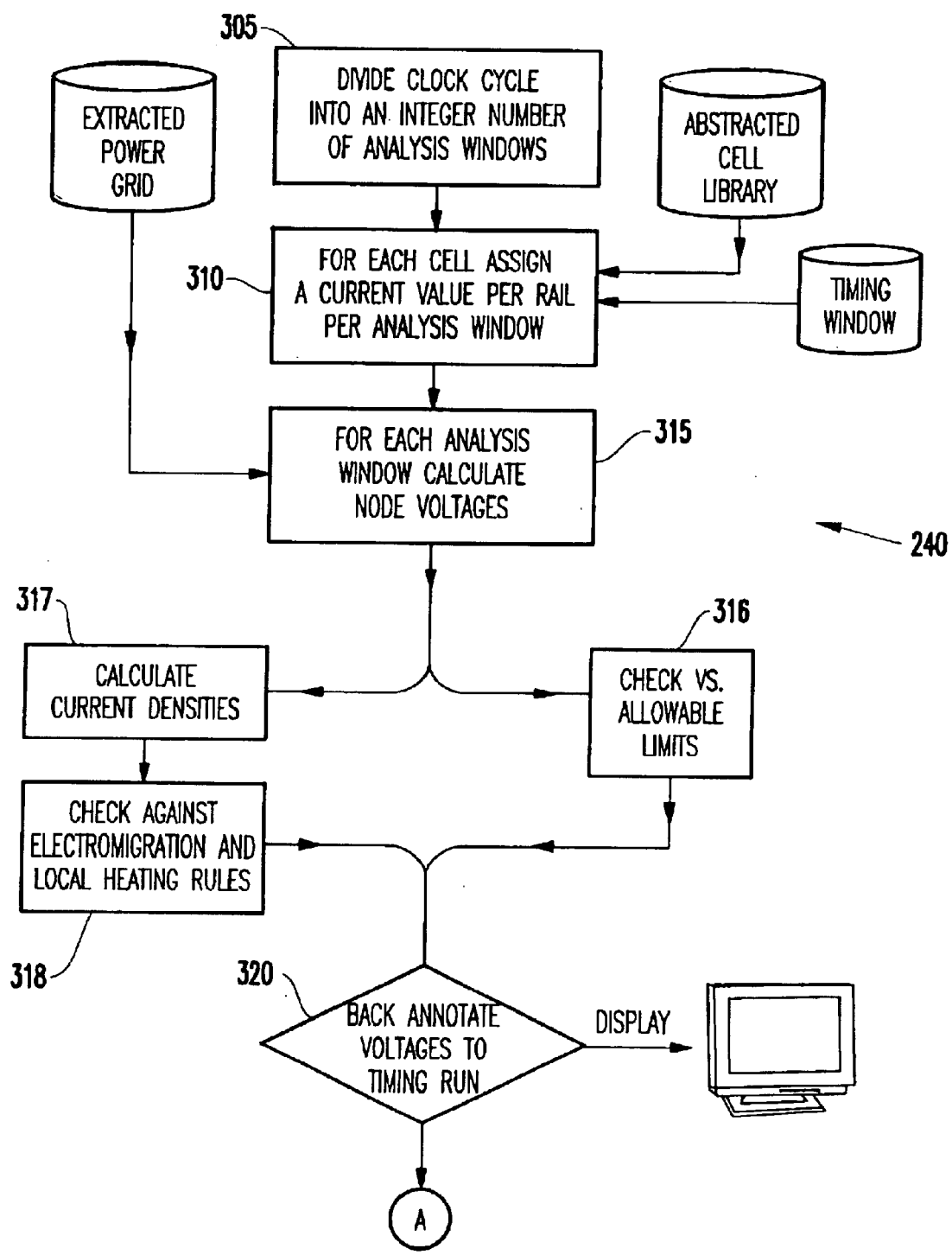
FIG. 3 is a flow diagram illustrating a method for performing static timing analysis according to the present invention.

Referring now to FIG. 3, to start the static timing analysis (240), it is needed to divide (305) the single clock cycle into an integer number of analysis windows (i.e., "buckets") to determine which of the circuits may be switching simultaneously. The more buckets to which the circuits can be assigned, the fewer circuits there are in each bucket (i.e., switching simultaneously) and, therefore, the more pessimism that can removed. However, there is a limit as to the number of buckets into which the clock cycle can be divided for accuracy reasons. For instance, the inventors have chosen to limit the bucket size so that it must be larger than or equal to the rise (or fall) time that captures 95% of the signals on the chip. This percentage was found by the inventors to be effective, although it is by no means exclusive. A smaller percentage introduces more error while a larger percentage constrains the bucket size and, therefore, results in more pessimism. This method of setting the bucket size is what drives the assumption in the inventive method 200 that the signals are switching "quickly". If the circuits are switching slowly, the bucket size is large and the inventive method 200 does not remove any pessimism. If the circuits switch quickly, however, the inventive method 200 results in more buckets, and all of the circuits on the chip will spread into a larger number of buckets. Therefore, fewer circuits will be switching in any one bucket and more pessimism can be removed from the power distribution analysis.

Once the bucket size is chosen, each circuit (i.e., the charge used by each circuit) may be assigned (310) to one or more buckets based on its individual arrival times. For example, if a circuit switches quickly (e.g., 95% of the circuits), and its arrival time window (i.e., the period of time between the early arrival time and the late arrival time) corresponds with only a single bucket, the charge associated with the switching of that circuit is assigned (310) to only that timing bucket. If the circuit switches slowly (e.g., 5% of the circuits) the charge required for the switch is spread evenly through-out all of the timing buckets that the timing window interacts with, which is not physically correct but close enough to allow the task to be completed. Furthermore, if the circuit switches quickly but its timing window overlaps a bucket window (some unknown percentage of the 95% of the circuits), its charge is assigned (310) to each of the two buckets that it interacts with at its full strength. However, "double counting" this charge must be avoided, as described below. Any DC currents may be accounted for by adding the charge required to maintain the DC current across all timing buckets.

Circuits that switch quickly but have a relatively wide arrival time window are problematic in that, if they switch, they can switch anytime during the arrival time window. This arrival time window can interact with many timing bucket windows. The inventive method 200 accounts for these signals by allowing them to switch in every timing bucket with which they interact. To avoid double counting the charge associated with these switches, two unique simulations are performed for each timing bucket.

The first simulation assumes that every circuit that can switch within the given timing bucket switches. As an initial condition, for every timing bucket simulation but the first timing bucket, the simulation uses the results of the second simulation described below. The initial conditions of the first simulation of the first timing bucket are set by the DC currents in the chip. The charge information obtained from the static timing tool analysis is converted to a current waveform for each circuit. Alternatively, a current waveform could be captured as part of the static timing analysis and used for the timing bucket simulations. This first simulation give the worst case power distribution conditions for the timing bucket that is being simulated.

The second simulation for each timing bucket is used to determine the initial conditions for the first and second simulations of the following timing bucket. For this simulation, only those circuits whose arrival time window ends within the timing bucket are simulated. In this way, double counting of charge for those circuits with long arrival time windows is avoided, and the sum of the charge that is required by the chip is correct. In addition, the worst case for each timing bucket is obtained through the use of the first simulation for each timing bucket.

For each timing bucket simulation, the inventive method 200 calculates (315) node voltages. Here, the resistors and capacitors of the simulation model from the extracted power grid are attached to ideal voltage sources in the area of the power grid to be powered from the external system. The same model is then simulated with the current waveforms, as calculated above, and the node voltages are measured at the point where the circuits attach to the distribution. This is where problems are identified. For example, if the voltage is too low or if it deviates too much from the ideal supply then the circuit might not function properly. If the grid is over-designed and no voltage collapse at all is realized, it might be possible to design the grid less aggressively (i.e., with less power supply).

Further, the inventive method 200 may check (316) the calculated voltage information against allowable limits. In addition, this voltage information may be used to calculate (317) current densities. Over the course of a cycle, current density may be calculated based on a time average of the current. Further, this current density information may be used to check (318) the circuit for electromigration and to ensure that the circuit complies with local heating rules.

In addition, when static timing analysis is performed, the voltage that supplies the circuits is initially assumed to be a known quantity. In reality, though, when circuits switch they actually degrade the power supply some. Therefore, the inventive method 200, may back annotate (320) voltages to the static timing run. Therefore, as shown in FIG. 2, after calculating the node voltages for each analysis window, if a voltage collapse is identified, the timing assertions can be adjusted and the static timing run (230) can be re-executed using the actual voltage for a more accurate analysis. Of course, this is unnecessary if the accuracy of the initial results are considered satisfactory.

Furthermore, the inventive method 200 may use the results of the static timing analysis (240) to redefine (245) the physical design (220) of the chip. For example, the results of the analysis (240) can be used redesign the chip to either add power or reduce power in order to solve a power distribution problem or merely to optimize power distribution on the chip so that, for example, chip size can be minimized.

The inventive method 200 may also use the current waveform data which was generated in the static timing analysis (240) to generate a graphical map (250) of the power distribution on the chip. The designer can use this map, for example, to visually identify and resolve power distribution problem areas on the chip.

Furthermore, the present invention may be implemented in an information handling/computer system. For example, FIG. 4 shows a typical hardware configuration of an information handling/computer system for analyzing power distribution in accordance with the invention.

Figure 4:
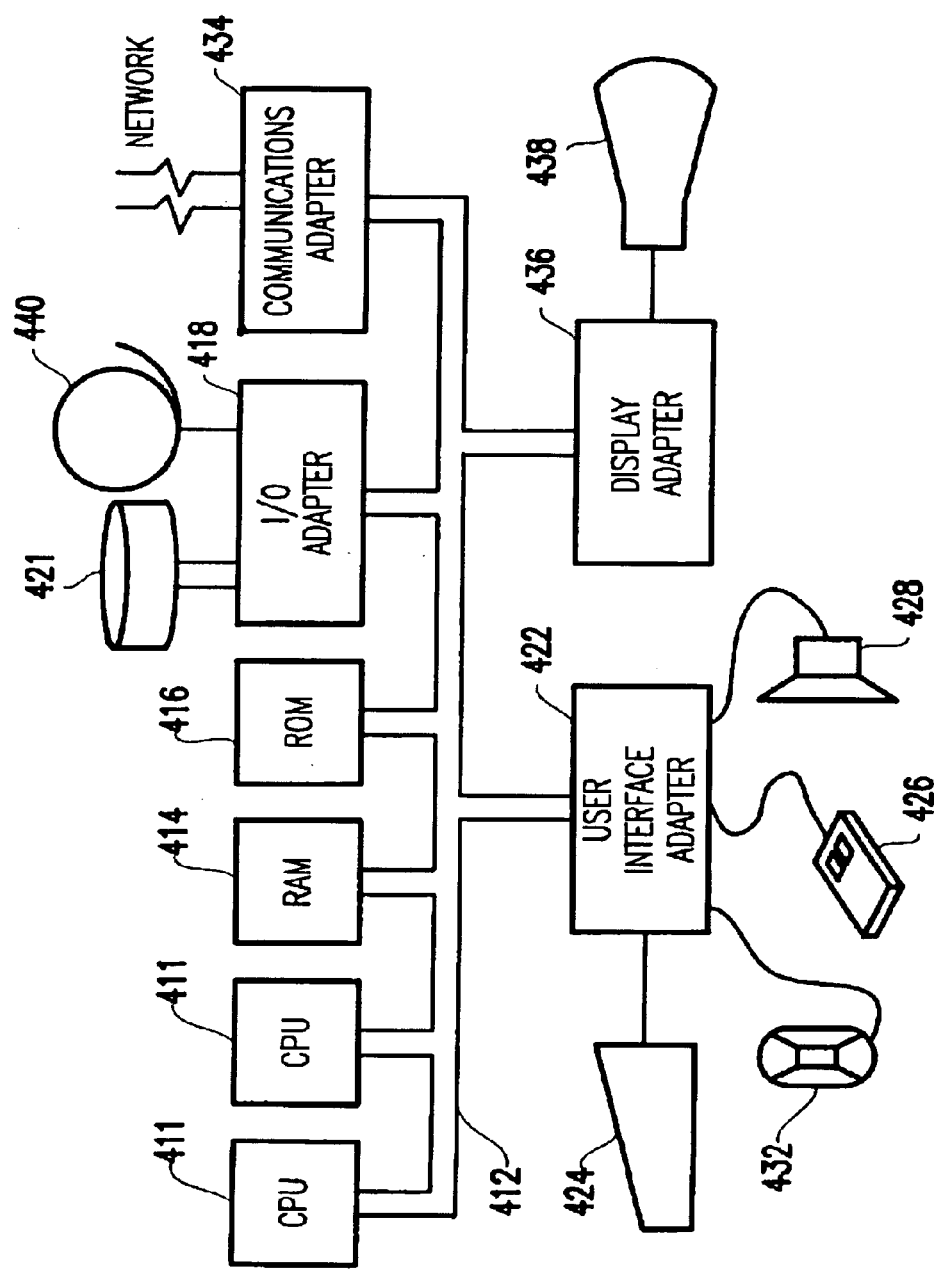
FIG. 4 illustrates an exemplary hardware/information handling system 400 for incorporating the present invention therein.

As shown in FIG. 4, the inventive information handling/computer system (400) preferably has at least one processor or central processing unit (CPU) 411. The CPUs 411 are interconnected via a system bus 412 to a random access memory (RAM) 414, read-only memory (ROM) 416, input/output (I/O) adapter 418 (for connecting peripheral devices such as disk units 421 and tape drives 440 to the bus 412), user interface adapter 422 (for connecting a keyboard 424, mouse 426, speaker 428, microphone 432, and/or other user interface device to the bus 412), a communication adapter 434 for connecting an information handling system to a data processing network, the Internet, an Intranet, a personal area network (PAN), etc., and a display adapter 436 for connecting the bus 412 to a display device 438 and/or printer 439 (e.g., a digital printer or the like).

In addition to the hardware/software environment described above, a different aspect of the invention includes a computer-implemented method for performing the above method. As an example, this method may be implemented in the particular environment discussed above.

Such a method may be implemented, for example, by operating a computer, as embodied by a digital data processing apparatus, to execute a sequence of machine-readable instructions. These instructions may reside in various types of signal-bearing media.

Thus, this aspect of the present invention is directed to a programmed product, comprising signal-bearing media tangibly embodying a program of machine-readable instructions executable by a digital data processor incorporating the CPU 411 and hardware above, to perform the method of the invention.

Figure 5:
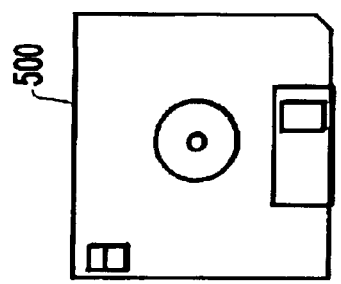
FIG. 5 illustrates a signal bearing medium 500 (e.g., storage medium) for storing steps of a program of a method according to the present invention.

This signal-bearing media may include, for example, a RAM contained within the CPU 411, as represented by the fast-access storage for example. Alternatively, the instructions may be contained in another signal-bearing media, such as a magnetic data storage diskette 500 (FIG. 5), directly or indirectly accessible by the CPU 411.

Whether contained in the diskette 500, the computer/CPU 411, or elsewhere, the instructions may be stored on a variety of machine-readable data storage media, such as DASD storage (e.g., a conventional "hard drive" or a RAID array), magnetic tape, electronic read-only memory (e.g., ROM, EPROM, or EEPROM), an optical storage device (e.g.

CD-ROM, WORM, DVD, digital optical tape, etc.), paper "punch" cards, or other suitable signal-bearing media including transmission media such as digital and analog and communication links and wireless. In an illustrative embodiment of the invention, the machine-readable instructions may comprise software object code, compiled from a language such as "C", etc.

Figure 6:
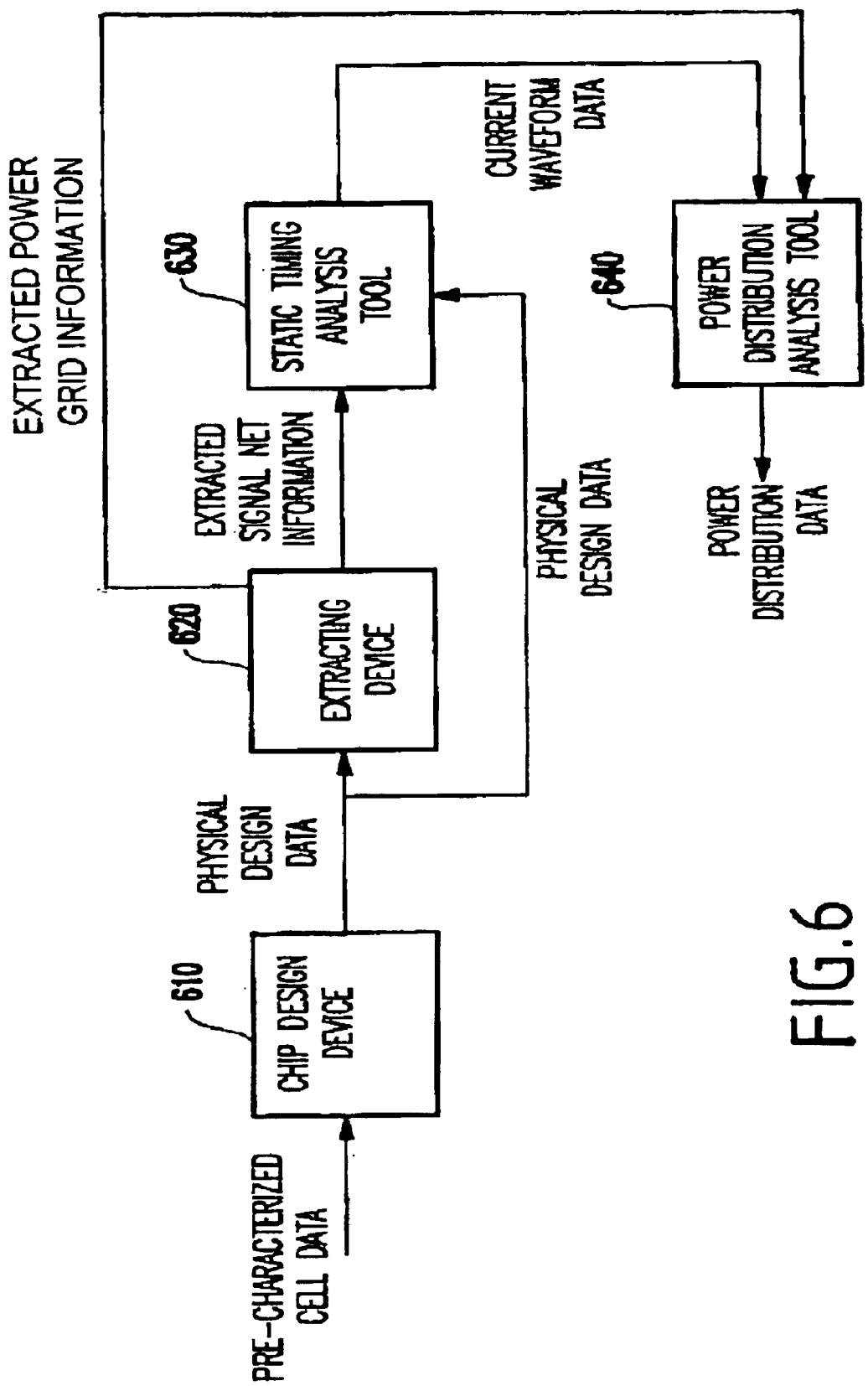
FIG. 6 illustrates a system for analyzing power distribution according to the present invention.

FIG. 6 illustrates a system 600 for analyzing power distribution according to a preferred embodiment of the present invention. The inventive system 600 includes a chip design device 610 into which precharacterized cell data is input. The chip design device 610 uses this data to logically and physically design the chip, and output physical design means to an extracting device 620.

As noted above, the extracting device 620 extracts the parasitic resistances, capacitances and inductances from the physical design to output an extracted netlist.

The inventive system 600 inputs the extracted netlist data into the static timing analysis tool 630. As explained above, the static timing analysis tool calculates circuit timing arrival windows within a clock cycle of the chip which the inventive system then divides into a plurality of time periods to generate switching information including whether a circuit is capable of switching in each time period. The inventive system 600 then inputs the extracted power grid information to a power distribution analysis tool 640 to analyze the power distribution of the chip.

With its unique and novel features and designs, the inventive system and method provide fast and effective means for accurately analyzing the power distribution on an integrated circuit. The inventive system and method quickly and accurately predicts the current waveforms while not overpredicting them by so much that the product is grossly overdesigned. Further, power distribution analysis can be performed using the total charge required over a given period of time, therefore, the exact shape of the current waveform is not necessary.

While a preferred embodiment of the present invention has been described above, it should be understood that it has been provided as an example only. Thus, those skilled in the art will recognize that the invention can be practiced with modification within the spirit and scope of the appended claims.

What we claim is:

1. A method of analyzing voltage drops on at least one power grid in an integrated circuit chip, comprising:
    dividing a clock period of said integrated circuit chip into a plurality of time periods;
    performing a static timing analysis to obtain current waveform data for said plurality of time periods far a plurality of cells within said at least one power grid of said integrated circuit chip; and
    performing at least one simulation of said at least one power grid using extracted power grid information within said at least one power grid, placement information for said plurality of cells, and said current waveform data to calculate at least one voltage at a plurality of locations within said power grid.

2. The method according to claim 1, wherein said performing said static timing analysis comprises using pre-characterized cell library information.

3. The method according to claim 1, further comprising: computing at least one current density on at least one element of said power grid.

4. The method according to claim 3, further comprising: modifying said integrated circuit chip based on said at least one current density.

5. The method according to claim 3, further comprising:
    checking said voltages against allowable limits; and
    checking said at least one current density against at least one of electromigration limits and local heating rules.

6. The method according to claim 1, further comprising: modifying said integrated circuit chip based on said at least one voltage.

7. The method according to claim 6, wherein said method is performed by using a digital data processing apparatus.

8. The method according to claim 1, wherein each of said time periods is greater than or equal to at least one of rise and fall times of a predetermined fraction of signals on said integrated circuit chip.

9. The method according to claim 1, wherein said at least one voltage comprises a voltage during each of said plurality of time periods.

10. The method according to claim 1, further comprising:
    performing another static timing analysis using said at least one voltage determined in said performing said at least one simulation of said at least one power grid.

11. The method according to claim 1, further comprising:
    generating a graphical map of said at least one voltage and said plurality of locations.

12. A system for analyzing power distribution in an integrated circuit chip comprising:
    a chip design device which uses pre-characterized cell data to logically and physically design said integrated circuit chip;
    a power grid extracting device which inputs physical design data from said chip design device and generates extracted signal net information; and
    a static timing analysis tool which divides a clock period of said integrated circuit chip into a plurality of time periods, and inputs said extracted signal net information and said physical design data and generates current waveform data for said time periods.

13. The system according to claim 12, further comprising:
    a power distribution analysis tool which reads as input said current waveform data and power distribution data and creates node voltage information.

14. The system according to claim 13, wherein said power distribution analysis tool generates a graphical map of a power distribution on said integrated circuit chip.

15. The system according to claim 12, wherein said pre-characterized cell data is included within a pre-characterized cell library.

16. The system according to claim 12, wherein said pre-characterized cell data comprises charge data, timing data, voltage data, temperature data, load data, input slew rate data, direct current data and process corner data.

17. The system according to claim 12, wherein said power grid extracting device extracts parasitic resistors, capacitors and inductors from a physical design of said integrated circuit chip.

18. The system according to claim 12, wherein said current waveform data generated during an operation of said system is input to said chip design device during a next operation of said system to refine a physical design of said integrated circuit chip.

19. The system according to claim 12, wherein said static timing analysis tool determines when a current is required on said integrated circuit chip, and an amount of current required on said integrated circuit chip.

20. The system according to claim 12, wherein said static timing analysis tool disregards circuits which cannot switch during a same time period.

21. The system according to claim 12, wherein each of said time periods is greater than or equal to a rise or fall time that captures a predetermined fraction of signals on said integrated circuit chip.

22. The system according to claim 12, wherein said static timing analysis tool assigns a charge used by a circuit to at least one time period.

23. The system according to claim 22, wherein said power distribution analysis tool checks calculated node voltages against allowable limits, electromigration rules and local heating rules, and calculates current densities using said calculated node voltages.

24. The system according to claim 23, wherein node voltages calculated during a static timing analysis are back annotated into said power distribution analysis tool during a next static timing analysis to re-calculate node voltages.

25. A programmable storage medium tangibly embodying a program of machine-readable instructions executable by a digital processing apparatus to perform a method of analyzing voltage drops on at least one power grid in an integrated circuit chip, said method comprising:

dividing a clock period of said integrated circuit chip into a plurality of time periods;

performing a static timing analysis to obtain current waveform data for said plurality of time periods for a plurality of cells within said at least one power grid of said integrated circuit chip; and performing at least one simulation of said at least one power grid using extracted power grid information, placement information for said plurality of cells, and said current waveform data to calculate at least one voltage at a plurality of locations within said power grid.

26. The programmable storage medium according to claim 25, wherein said performing said static timing analysis comprises using pre-characterized cell library information.

27. The programmable storage medium according to claim 26, wherein said method further comprises:

computing at least one current density on at least one element of said power grid.

28. The programmable storage medium according to claim 27, wherein said method further comprises:

checking said voltages against allowable limits; and checking said at least one current density against at least one of electromigration limits and local heating rules.

29. The programmable storage medium according to claim 28, performing another static timing analysis using said at least one voltage determined in said performing said at least one simulation of said at least one power grid.

30. The programmable storage medium according to claim 26, wherein said method further comprises:

modifying said integrated circuit chip based on said at least one current density.

31. The programmable storage medium according to claim 25, wherein said method further comprises:

modifying said integrated circuit chip based on said at least one voltage.

32. The programmable storage medium according to claim 25, wherein said static timing analysis comprises:

disregarding circuits which cannot switch during a same time period.

33. The programmable storage medium according to claim 25, wherein said at least one voltage comprises a voltage during each or said plurality of time periods.

34. The programmable storage medium according to claim 25, wherein said method further comprises:

generating a graphical map of said at least one voltage and said plurality of locations.

* * * * *